United States Patent [19]
Eachus et al.

[11] 4,013,835
[45] Mar. 22, 1977

[54] DATA ENTRY SYSTEM

[75] Inventors: Joseph J. Eachus, Cambridge;
Theodore S. Graff, Sudbury; Douglas H. Seggelin, Whitman, all of Mass.

[73] Assignee: Honeywell Information Systems, Inc., Waltham, Mass.

[22] Filed: Oct. 23, 1975

[21] Appl. No.: 625,240

[52] U.S. Cl. .............................. 178/18; 340/365 A
[51] Int. Cl.² ........................................ G08C 21/00
[58] Field of Search ........................ 178/18, 19, 20; 340/365 R, 365 A, 365 E; 33/1 M

[56] References Cited
UNITED STATES PATENTS

| | | | |
|---|---|---|---|
| 3,503,031 | 3/1970 | Nyhus et al. | 340/365 A |
| 3,539,995 | 11/1970 | Brandt | 178/19 |
| 3,757,322 | 9/1973 | Barkan et al. | 178/18 |
| 3,758,718 | 9/1973 | Fletcher et al. | 178/18 |
| 3,860,754 | 1/1975 | Johnson et al. | 178/18 |
| 3,944,740 | 3/1976 | Murase et al. | 178/18 |

*Primary Examiner*—Thomas A. Robinson
*Attorney, Agent, or Firm*—William F. White; Ronald T. Reiling

[57] ABSTRACT

A novel data entry system is disclosed which comprises both a touch sensitive device and a location identification device. The touch sensitive device includes a printed circuit board arrangement of conductors which define data input locations that are touch sensitive. The locations are touch sensitive by virtue of a layer of variable resistance material disposed over the printed circuit board which is highly conductive when subjected to touch pressure. The electrical conductivity of a touched location is sensed by the location identification device which thereafter provides a digital coding of the location and maintains the same until the touch pressure has been removed. The location identification device moreover prevents the double entry of data due to any variation in the touch pressure.

23 Claims, 9 Drawing Figures

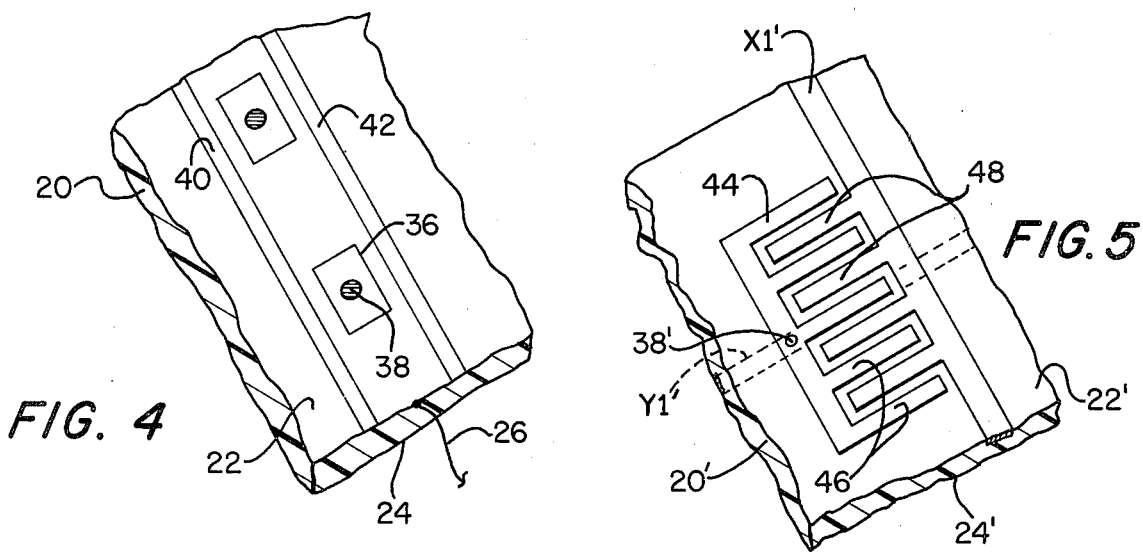
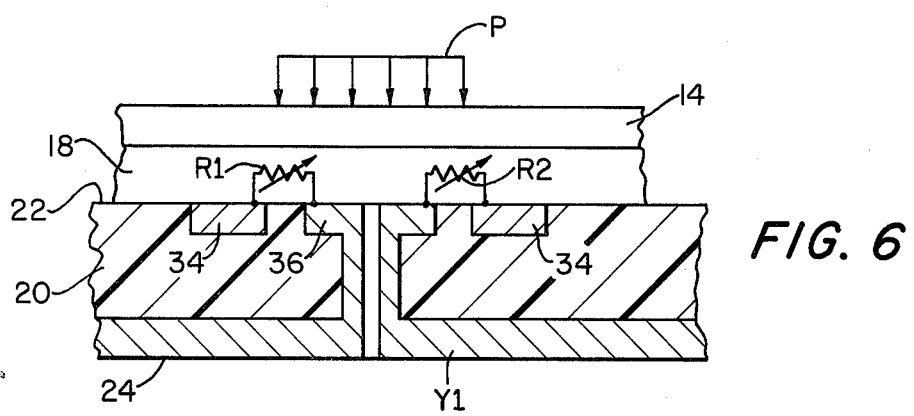
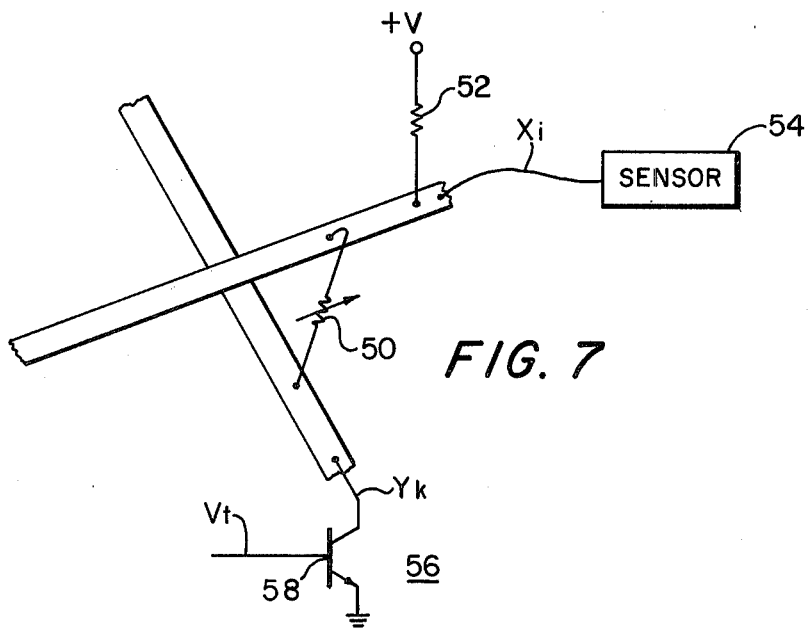

DATA ENTRY SYSTEM

BACKGROUND OF THE INVENTION

This invention relates to data entry systems. In particular, this invention relates to a manual type of data entry system.

Data entry through the use of various types of manual data entry systems is well known. These systems normally consist of a touch sensitive device having a plurality of touch sensitive locations, each of which is operative to transmit a signal when touched. Heretofore, most of these touch sensitive devices have included complicated mechanical and electromechanical touch sensitive elements. Such elements have often not allowed for a close spacing within a confined area. Moreover, these touch sensitive devices have often employed complicated electronic componentry for identifying the particular location that has been touched.

OBJECTS OF THE INVENTION

It is an object of this invention to provide an improved touch sensitive data entry system.

It is another object of this invention to provide a touch sensitive device having relatively uncomplicated touch sensitive elements.

It is still another object of this invention to provide a touch sensitive device having a large plurality of closely spaced touch sensitive elements.

It is an even further object of this invention to provide a location identification device which allows for a rapid and definitive identification of a touch location by relatively uncomplicated electronic componentry.

SUMMARY OF THE INVENTION

To achieve the above objects, a data entry system is provided which consists of a touch sensitive device in combination with a location identification device. The touch sensitive device comprises an arrangement of conductive lines imprinted on the top and bottom surfaces of a printed circuit board. The printed circuit board contains various conductive means capable of establishing electrical paths between the conductors on the top and bottom surfaces. Each conductive means is normally open and is closed whenever localized pressure is applied to a layer of electrically conductive material positioned on the top surface of the printed circuit board. A so-closed conductive means thereafter conducts when a conductor on the top surface crossing over a conductor on the bottom surface at the pressured location has been appropriately energized.

The location identification device associated with the touch sensitive device identifies which particular conductive means has been made conductive. This is accomplished by sequentially testing each conductive means so as to identify the particular location that has been subjected to stress or pressure. The location identification device temporarily isolates the particular depressed location until the data appearing at the location has been transmitted. Further pressure to the same location will not be interpreted as a double or multiple entry of the same data.

BRIEF DESCRIPTION OF THE DRAWINGS

For a better understanding of the present invention, reference should be made to the accompanying drawings wherein:

FIG. 4 is a detailed illustration of an alternative conductive means;

FIG. 5 is a detailed illustration of yet another alternative conductive means;

FIG. 6 is a cross-sectional view of the conductive means of FIG. 3;

FIG. 7 is an electrical schematic depicting the conductive means of FIGS. 3 and 4;

DESCRIPTION OF THE PREFERRED EMBODIMENT

Figure 1:
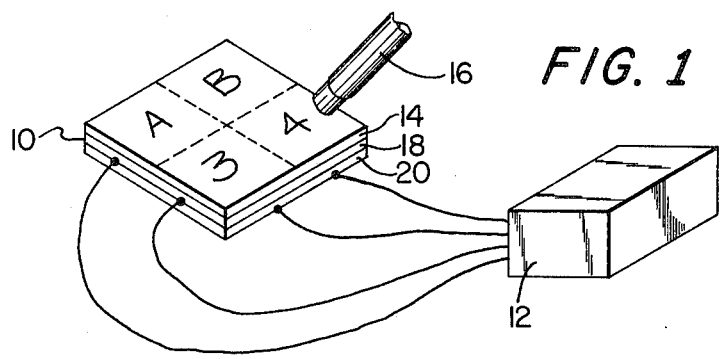
FIG. 1 is a schematic illustration of the touch sensitive device in combination with a location identification device.

Referring now to FIG. 1, a touch sensitive device 10 is electrically connected to a location identification device 12. The touch sensitive device 10 is seen to comprise three distinct elemental layers. A topmost layer 14 contains a 2 × 2 matrix of alpha-numeric characters. It is to be understood that any particular matrix location on the layer 14 can be depressed by a stylus 16 which can take the form of a pencil as shown. It is to be appreciated that the stylus can also include any means for applying pressure including a human finger. The topmost layer 14 is preferably a uniform material which is sufficiently flexible to be depressed locally while at the same time being firm enough to transmit only a local pressure from the stylus 16.

Beneath the topmost layer 14 is a layer 18 of electrically conductive material which has certain electrical properties to be described in detail hereinafter. Beneath the elastomer layer 18 is a rigid printed circuit board 20 having a set of conductive strips on the top and bottom surfaces thereof. The end terminals for the top and bottom printed circuit conductors are seen to be electrically connected to the location identification device 12.

Figure 2:
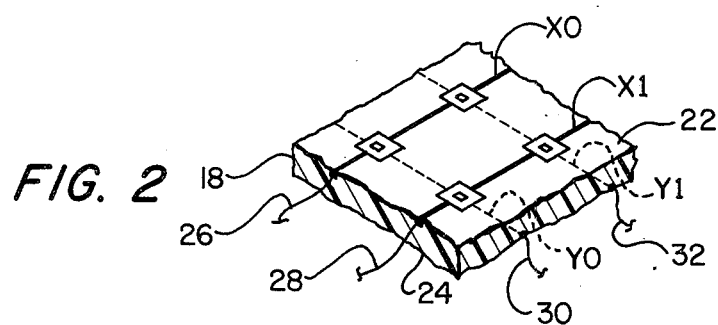
FIG. 2 schematically depicts the conductors and conductive means within the touch sensitive device of FIG. 1.

Turning now to FIG. 2 wherein the printed circuit board 20 is more particularly depicted, it is seen that a pair of parallel electrical conductors X0 and X1 are imprinted on a top surface 22. A second set of parallel conductors, Y0 and Y1, orthogonal to the first set, are imprinted on a bottom surface 24. Each set of parallel conductors are preferably strip conductors fabricated on the printed circuit board 20 by printed circuit techniques well known in the art. The ends of the various parallel conductors leave the printed circuit board 20 as extensions 26 through 32. These extensions run to the location identification device 12. It is to be understood that while only a pair of X and Y conductors have been shown, the number of conductors can be significantly increased according to the invention. For simplicity, the number of conductors have been limited to the illustrated pairs in each direction.

It is to be noted that each of the X conductor strips imprinted on the top surface 20 includes an open rectangle such as 34 over each Y conductor which crosses thereunder. Each open rectangular 34 forms part of an individual electroconductive means between a particular X conductor and a particular Y conductor passing underneath. Each electroconductive means includes a local portion of the layer 18 of electrically conductive material. This will be explained in detail hereinafter.

Figure 3:
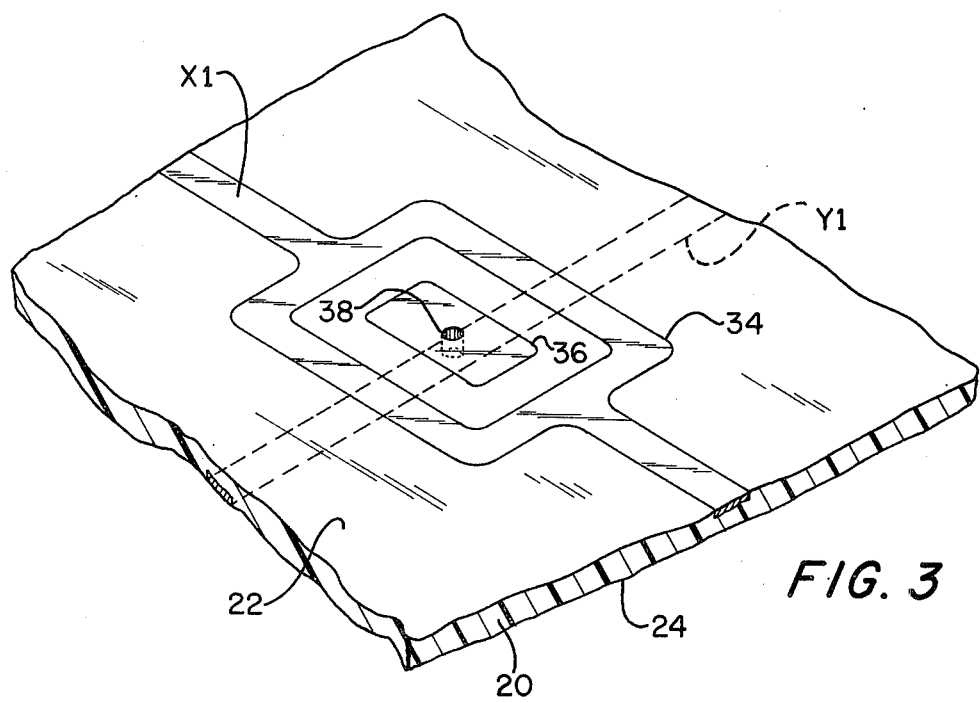
FIG. 3 is a detailed illustration of a particular conductive means.

Referring to FIG. 3, the open rectangle 34 is illustrated in more detail and is in particular seen to completely encompass a pad 36 imprinted on the top surface 22. A plated-through hole 38 located in the middle of the pad 36 extends through the printed circuit board 20 to the Y1 conductor imprinted on the bottom surface 24 of the printed circuit board. The plated-through hole 38 and the pad 36 form an electrical terminal for the conductor Y1 on the top surface 22.

It is to be appreciated that the configurations of both the X conductor and the pad 36 on the surface 22 can vary within the scope of the invention. Referring to FIG. 4, the X1 conductor with its individual open rectangles is replaced by a pair of parallel conductors 40 and 42. A variation in both the pad 36 and the X1 conductor is illustrated in FIG. 5. A pad 44 on the top surface 22' of the printed circuit board 20' contains a plurality of fingers 46 which are interspersed in a closely-spaced relationship with fingers 48 extending from the X1' conductor. The pad 44 being connected through to the Y1' conductor via the plated-through hole 38', establishes a Y terminal on the surface 22' which is touch-sensitive over a broad area. As will become apparent hereinafter this touch sensitivity over a broad area is attributable to the local conductivity of the electrically-conductive layer 18 in combination with a spacing of the Y terminal with respect to the X conductor.

Having now described various terminal configurations for the Y conductor on the top surface 22 and moreover having described how an X conductor can be configured relative thereto, it is now appropriate to examine how the electrical paths are established between these two top surface elements. The electrical paths between the open rectangle 34 and the pad 36 of FIG. 3 are established through the electrically conductive layer 18. This is illustrated in FIG. 6 by the resistive paths R1 and R2 which are variable depending on the pressure P applied through the layer 14 to the electrically conductive layer 18. In order for the resistance to be variable in the electrically conductive layer 18, it is preferable that the electrically conductive material be a vary poor electrical conductor when unstressed and be a reasonably good conductor when subjected to local pressure. It is moreover preferable that the electrically conductive material be sufficiently flexible so as to only be locally compressible. The electrically conductive material should also be isotropically conductive, i.e. conductive in all directions.

An electrically conductive material with the aforementioned properties could be an elastomer embedded or otherwise impregnated with electrically conductive particles. The pressure sensitive electroconductive elastomer utilized in the preferred embodiment of the present invention consisted of a silicon rubber embedded with silver particles. This material had a normally high resistance in the mega ohm range, and a resistance of five to tem ohms when subjected to a normal finger pressure of approximately 15 pounds per square inch. This particular pressure sensitive, electroconductive elastomer can be obtained from Dynacon Industries, Leonia, N.J.

It is to be understood that an appropriate spacing must be maintained between the pad 36 and the open rectangle 34 in order to establish the resistive paths through the electroconductive layer 18. For the above-mentioned pressure sensitive electroconductive material, it has been determined that a spacing between 2 thousandths of an inch and 20 thousandths of an inch was adequate. This would mean the inner perimeter of the open rectangle 34 should be spaced at least 2 thousandths of an inch but not more than twenty thousandths of an inch from the pad 36.

Having now described the manner in which a low resistance electrical path is established between an X and a Y conductor, it is now appropriate to turn to FIG. 7 which schematically depicts the manner in which this electrical path is energized between a conductor $X_i$ and a conductor $Y_k$. It is to be understood that the subscripts $i$ and $k$ denote any particular X and Y strip on the printed circuit board 20. As has been previously explained, each $X_i$ conductor is resistively connected to each $Y_k$ conductor passing underneath by a variable resistance 50. This variable resistance 50 is synonomous with the variable resistances R1 and R2 of FIG. 6.

The $X_i$ conductor is moreover attached through a high resistance 52 to a power supply voltage V. The variable resistance 50 will normally also be extremely high so that there will be negligible current present in the $X_i$ conductor. This current condition will be logically equivalent to a binary one which will be sensed by a sensor 54 attached to the X conductor. The logical state indicated by the current condition present on the X conductor strip changes when: (1) a low resistance path is established through the variable resistance 50, and (2) the $Y_k$ conductor is grounded. This latter condition occurs when a transistor 56 connected to the conductor strip $Y_k$ is caused to conduct. This is accomplished by applying an appropriate test signal voltage $V_t$ to the base 58 of the transistor 56. If pressure has been applied to the particular location defined by the $X_i$ and $Y_k$ conductors, then the variable resistance 50 will be low thereby causing conduction from the power supply voltage V through the transistor 56 to ground. The resulting current condition in the conductor $X_i$ will indicate a logical zero condition to the sensor 54. As will be explained in detail hereinafter, when the sensor 54 indicates a logical zero, a particular location on the touch sensitive device 10 can be identified by the location identification device 12.

In order to allow the $X_i$ conductor to register a logical zero at the sensor 54, it is necessary to carefully define the minimum necessary current through the variable resistance 50. This is in large part dependent upon the amount by which the variable resistance 50 changes when subjected to pressure. For a variable resistance normally in the mega-ohm range, which subsequently changes under pressure to at least 100 ohms, the value of the high resistance 52 is preferably set at 8700 ohms for a power supply voltage of +5 volts. It is to be noted that the preferred cut-off of 100 ohms is substantially greater than the known 5–10 ohm resistivity of the pressure sensitive variable resistance material when subjected to human finger pressure. The 100 ohm cut-off insures detection of a location not experiencing full fingertip pressure.

Figure 8:
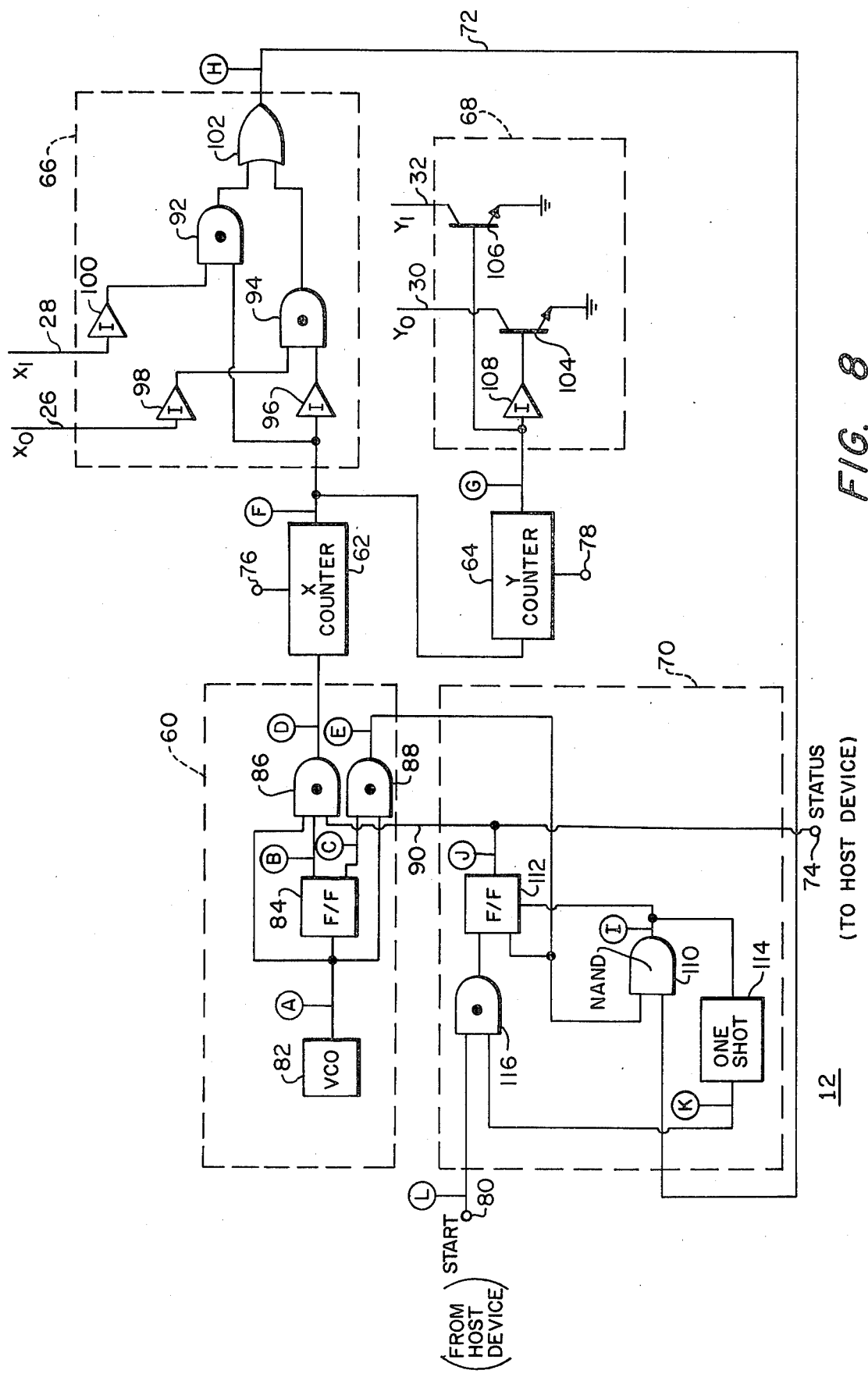
FIG. 8 is a detailed illustration of the location identification device of FIG. 1.

Having described the touch sensitive device 10, it is now appropriate to turn to a description of the location identification device 12 which is illustrated in detail in FIG. 8. It will be remembered that the location identification device 12 is connected to the X and Y conductors of the touch sensitive device via the lines 26–32. These particular line connections are illustrated in FIG. 8. The location identification device 12 sequentially tests the X and Y conductors through these lines so as to identify a particular location under pressure. This testing begins with a clock 60 driving an X counter 62 that in turn drives a Y counter 64. The X counter 62 sequentially activates gates within a sensor 66 which sense the signal levels of the X conductors applied thereto. At the same time, the Y counter 64 sequentially grounds the Y inputs to a Y testing means 68. If a particular location has been depressed, the X sensor 66 will detect a logical zero on the particular X conductor that identifies the location when the $Y_k$ conductor identifying the location is being sequentially tested by the Y testing means 68. At this time, the X sensor signals a status network 70 via a line 72 that a depressed location has been found. The status network 70 disengages the clock 60 thereby freezing the X count and Y count. The status network 70 furthermore indicates at a status terminal 74 that a depressed location has been detected and the X and Y digital coding for the location is available at terminals 76 and 78 of the X and Y counters. The status network 70 is finally operative to prevent the initiating of any further testing until an appropriate amount of time has lapsed from when the X sensor 66 first went high. This latter function effectively disables any further start initiation at a terminal 80.

Having now described the overall functioning of the location identification device 12, it is now appropriate to turn to a specific discussion of the various elements previously outlined above. In this regard, reference will also be made to various signal waveforms in FIG. 9, which occur at the various alphabetically labelled locations in FIG. 8.

Figure 9:
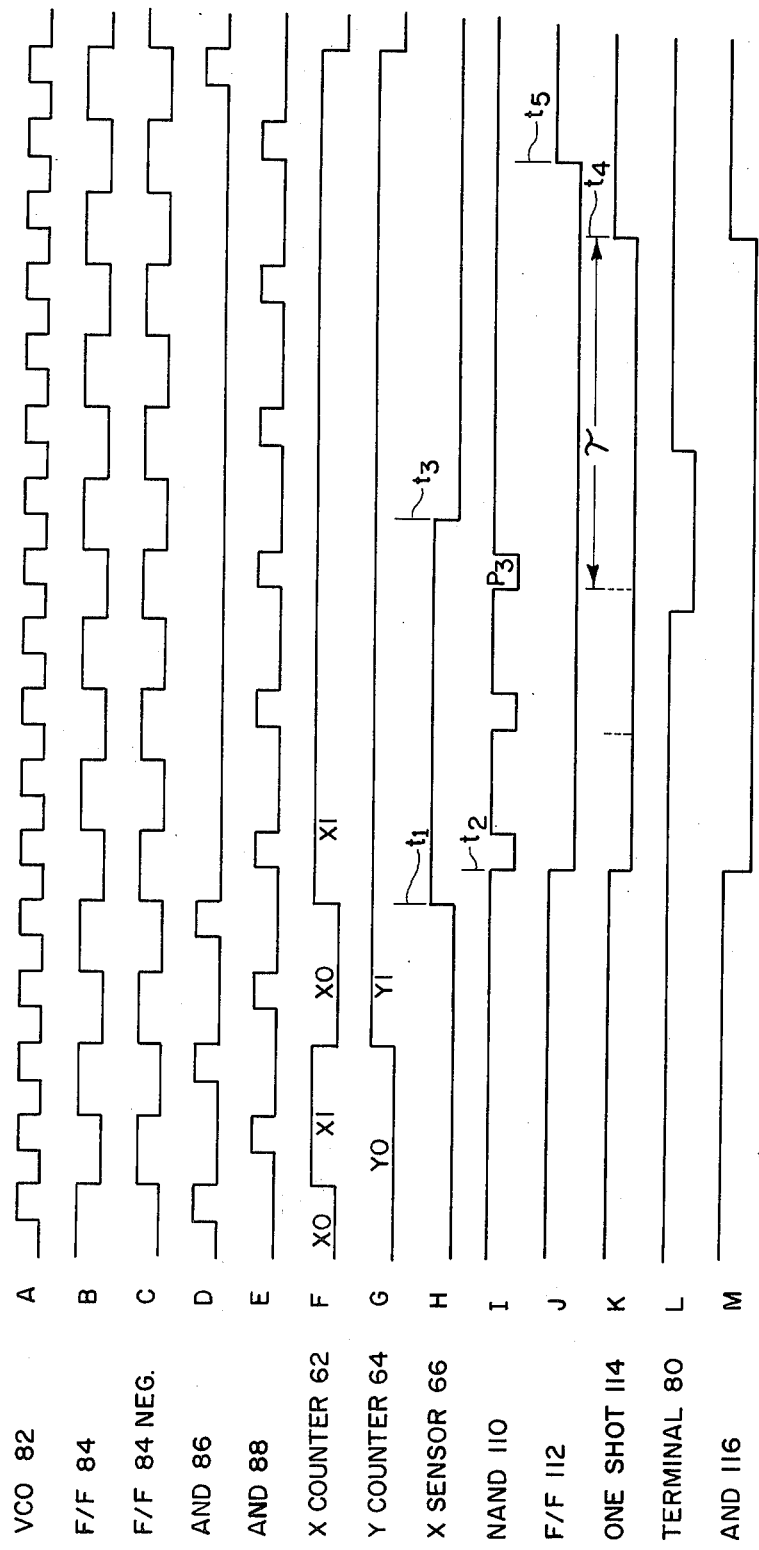
FIG. 9 is an illustration of various signal conditions present within the location identification device of FIG. 6.

The clock 60 begins with a voltage controlled oscillator 82 which produces a VCO waveform A in FIG. 9. The VCO signal A is frequency divided by a flip flop 84 so as to generate the extended VCO signal waveforms B and C indicated in FIG. 9. The extended VCO signals B and C are combined with the original VCO signal A at the AND gates 86 and 88. The AND gate 86 will produce a count signal D when the signal from the status network 70 appearing on a line 90 is logically high. The AND gate 88 on the other hand continually produces a signal E for the status network 70.

The count signal D from the AND gate 86 provides a count cadence to the X counter 62. Referring to FIG. 9, the output signal F of the X counter 62 toggles on successive trailing edges of each pulse of the count signal D. The output signal F is in turn applied to the Y counter 64 which toggles on successive trailing edges of the X count signal F as is shown by waveform G. In this regard, the Y count will remain constant while the successive X counts are made. This means that the X count will first be binary zero and then a binary one indicating the conductors $X_0$ and $X_1$ of FIG. 2 for a given Y count. It is to be understood that the X count could be further extended to include multiple outputs indicative of higher ordered binary counts. The Y count could similarly reflect larger numbers of Y conductors.

Depending on the binary value of the X count, either an AND gate 92 or an AND gate 94 are enabled within the X sensor 66. This is accomplished by virtue of the signal from the X counter being applied directly to the AND gate 92 and being first inverted through an inverter 96 and thereafter applied to the AND gate 94. Each AND gate when enabled senses the inversion of the signal level present on a respective X conductor. The inversions of the X signal levels are accomplished through a set of inverters 98 and 100 as shown.

As has been previously explained with regard to FIG. 7, an X conductor will be logically low if pressure has been applied to a particular location definable by that X conductor having a Y conductor crossing underneath which has been grounded. When such occurs, the particular AND gate within the X sensor 66 will go logically high when enabled by the binary count signal from the X counter 62. The resulting signal output from either the AND gate 92 or the AND gate 94 is applied to an OR gate 102. The output of the OR gate 102 is in turn applied to the status network 70 over the line 72.

Before the signal level on a particular X conductor can go low, it is necessary that the Y conductor passing underneath the location experiencing pressure be appropriately grounded. This is accomplished by the Y testing means 68 which comprises a plurality of transistors such as 104 and 106. The collectors of each of these transistors is respectively connected to either a line 30 or 32 which in turn connects to a particular Y conductor of the printed circuit board 20. The base of the transistor 106 is directly connected to the output of the Y counter 64 whereas the base of the transistor 104 is connected through an inverter 108 to the output of the Y counter. The transistors 104 and 106 are sequentially made conductive by virtue of the Y count as defined by signal G.

To briefly summarize the above, the Y testing means 68 will sequentially ground the Y conductors on the printed circuit board 20 while the X sensor 66 will sequentially sense the signal level of the various X conductors. When the X and Y conductors identifying a particularly depressed location are simultaneously grounded and sensed, then the X sensor 66 will produce a logically high signal on the line 72. The signal present on the line 72 is identifiable by the waveform H in FIG. 9.

The above sequence of events is depicted in FIG. 9 wherein the waveforms F and G of the X and Y counters are seen to sequentially define the count of the location being tested. When the location defined by the crossing of the X1 and Y1 conductors is encountered at time $t_1$, the X sensor 66 goes high as is indicated by the signal H. The location which was thus depressed in FIG. 1 has now been identified in terms of an X and a Y count.

Referring now to FIG. 8, it is to be noted that the output signal from the X sensor 66 is applied over the line 72 to a NAND gate 110. The NAND gate 110 also receives the output signal E from the AND gate 88 within the clock 60. The NAND gate 110 goes low in response to both the signal H from the X sensor 66 and the signal E from the AND gate 88 being simultaneously logically high. This low signal level output from the NAND gate 110 resets a flip-flop 112 so as to cause the output signal J from the flip-flop 112 to go logically low. The output signal J from the flip-flop 112 constitutes the status level output for the status network 70. The status level output is made available to the clock 60 over a line 90 while the same is made available to a host device at a terminal 74. A logically low signal level from the status network 70 disables the AND gate 86 within the clock 60 so as to thereby discontinue the count signal D which in turn freezes X count and Y count present in the X counter 62 and the Y counter 64. At the same time, the logically low signal level present at the terminal 74 indicates to the host device that a depressed location has been identified and the location code therefore is present in the X counter and Y counter.

The above operation of the status network 70 is fully depicted in FIG. 9 wherein the output signal I of the NAND gate 110 is seen to go low at time $t_2$ in response to signals E and H being simultaneously high. This resets the flip-flop 112 low at time $t_2$ as is indicated by the waveform J in FIG. 9. The waveform J, representing the output signal condition from the status level network 70 disables the AND gate 86 within the clock 60. This is illustrated by the waveform D remaining low after time $t_2$. With the count signal waveform D low, the X and Y count within the location identification device are thus frozen.

The status network 70 maintains the location identification device 12 in this frozen condition as follows. A one-shot 114 is operative to provide a low signal level to an AND gate 116 in response to a low signal level from the NAND gate 110. This is illustrated in FIG. 9 by the waveform J which goes low at time $t_2$ in response to the logically low signal level of signal I. The one-shot circuit 114 is timed to remain logically low for a time period $\tau$ which is more than sufficient for the X sensor 66 to indicate the removal of pressure from the particularly depressed location on the device. The one-shot 114 is moreover continually reset by the NAND gate 110 as long as the X sensor 66 indicates that the particularly identified location is still depressed. The NAND gate 110 continually goes low in response to the clock pulse signal E periodically going high. The dotted resets of the one-shot circuit 114 occurring each time the NAND gate goes low are illustrated in the waveform K in FIG. 7. This continually occurs until a time $t_3$ wherein the signal H from the X sensor 66 goes logically low thereby indicating the removal of pressure from the touch sensitized location. The one-shot circuit 114 will thereafter continue to disable the AND gate 116 for a time $\tau$ following the last inverted pulse $P_3$ in the signal I from the NAND gate 110. It is not until a time $t_4$ that the AND gate 116 will become enabled so as to be capable of transmitting a logically high signal to the flip-flop 112. The latter event will occur when an appropriate START signal from the host device is provided to the terminal 80 of the status network. This is indicated by the signals L and M in FIG. 9 wherein the terminal 80 is normally logically high except during the time in which the digitally coded location present on the X and Y counters is being received by the host device. The AND gate 116 on the other hand will only go logically high at the time $t_4$.

The flip-flop 112 goes high at a time $t_5$ after the AND gate 116 has provided a logically high signal to the input thereof. The time $t_5$ is dictated by the leading edge of a clock pulse occurring in the clock signal E from the AND gate 88. At that time, the flip-flop 112 is clocked to follow the signal level from the AND gate 116 which is applied thereto. With the flip-flop 112 again going high, the AND gate 86 within the clock 60 is enabled thereby allowing the count signal D to begin again. The count signal D continually drives the X and Y counters until a new location on the touch sensitive device 10 has been depressed and subsequently defined by the appropriate X and Y count.

From the foregoing, it is to be understood that preferred embodiments of both the touch sensitive device 10 and the location identification device 12 have been illustrated. It is to be appreciated that both may be individually used within a data entry system. It is furthermore to be appreciated that certain elements of each may either be removed or substitutes may be found therefore without departing from the scope of the invention.

What is claimed is:

1. In a data entry system wherein data is entered by depressing locations on a touch sensitive device, apparatus for identifying a depressed location comprising:
   a matrix of conductors comprising a plurality of first conductors oriented in a first direction, a plurality of second conductors oriented in a second direction transverse to said first directions;
   a plurality of pressure sensitive electroconductive means for conducting electrical current between respective first and second conductors, each said pressure sensitive electroconductive means being operative to conduct an electrical current when the location immediate thereto has been depressed;
   means for sequentially testing each pressure sensitive electroconductive means for the existence of the current that is established between a respective first conductor and a respective second conductor when the location immediate thereto has been depressed; and
   means, responsive to said testing means, for terminating the testing of each pressure sensitve electroconductive means when a depressed location has been identified, said terminating means comprising:
   means, responsive to said testing means, for generating a status signal indicative of a depressed location having been identified,
   means for applying the status signal to said means for sequentially testing each electroconductive means so as to terminate the sequential testing, and
   means for temporarily maintaining the signal level of the generated status signal after the location is no longer depressed.

2. The apparatus of claim 1 wherein said means for maintaining the signal level of the generated status signal comprises:
   means for applying a bilevel signal to said means for generating a status signal, said bilevel signal having a time duration greater than the time required to remove pressure from a depressed location; and
   means for periodically triggering said means for generating a status signal so as to cause said status signal to logically follow the level of said bilevel signal.

3. The apparatus of claim 2 wherein said means for sequentially testing each pressure sensitive electroconductive means comprises:
   means for providing a second periodic signal; and
   means for applying the second periodic signal to said means for periodically triggering said means for generating a status signal.

4. The apparatus of claim 1 wherein said means for sequentially testing each pressure sensitive electroconductive means comprises:

means for providing a first periodic signal for use in sequentially testing each of said electroconductive means, and means for selectively gating the first periodic signal, said selective gating means being operative to inhibit the gating of the first periodic signal in response to the signal level of said status signal.

5. The apparatus of claim 4 wherein said testing means comprises:

means, responsive to said first periodic signal, for sequentially sensing the signal conditions of said plurality of first conductors; and means for sequentially grounding each of said plurality of second conductors so as to change the signal condition on a first conductor when a pressure sensitive electroconductive means electrically connected thereto has been subjected to externally applied pressure.

6. The apparatus of claim 5 wherein said plurality of pressure sensitive electroconductive means each comprise:

a terminal for one of said plurality of second conductors, said terminal being coplanar with said plurality of first conductors and spaced from a respective first conductor; and pressure sensitive, variable resistance material electrically connecting said terminal to said first conductor, said pressure sensitive material being operative to conduct electrical current between said respective first conductor and said terminal when depressed.

7. The apparatus of claim 6 wherein said plurality of first conductors and said plurality of second conductors lie on opposing surfaces of a rigid printed circuit board.

8. The apparatus of claim 7 wherein said variable resistance, pressure sensitive material is flexible relative to the rigid board upon which said first and second plurality of conductors lie.

9. The apparatus of claim 6 wherein said pressure sensitive, variable resistance material is isotropically conductive.

10. The apparatus of claim 9 wherein said variable resistance, isotropically conductive material comprises an elastomer embedded with electrically conductive particles.

11. The apparatus of claim 6 wherein said terminating means comprises:

means, responsive to said sensing means, for generating a status signal indicative of a depressed location having been identified; and means for temporarily maintaining the signal level of the generated status signal after the depressed location is no longer depressed.

12. The apparatus of claim 1 wherein said testing means comprises:

first means for sequentially counting said plurality of first conductors;

second means for sequentially counting said plurality of second conductors; and means for driving said first and second counting means, said driving means being responsive to the status signal from said terminating means so as to discontinue driving said first and second counting means when a depressed location has been identified.

13. A system for entering information, said system comprising:

a plurality of individually sensitive locations for entering information, each of said locations having a variable electrical conductivity so as to normally have a low conductivity which subsequently changes to a high conductivity when sensitized by entry of information for that location;

a plurality of means for sensing the electrical conductivity of each of said plurality of locations;

means for sequentially activating each of said plurality of sensing means; and means, responsive to said plurality of sensing means, for terminating the sequential activation of said sequential activating means when a high electrical conductivity has been sensed, said terminating means comprising:

means for maintaining the signal level of the generated status signal after the sensed high conductivity disappears.

14. The system of claim 13 wherein said means for maintaining the signal level of the generated status signal comprises:

means for applying a bilevel signal to said means for generating a status signal, said bilevel signal having a time duration greater than the time required to return a sensitized location to a low conductive state.

15. The system of claim 14 wherein said means for maintaining the signal level of the generated status signal further comprises:

means for periodically triggering said means for generating a status signal so as to cause said status signal to logically follow the level of said bilevel signal.

16. The system of claim 13 wherein said means for sequentially activating each of said plurality of sensing means comprises:

means for providing a first periodic signal to sequentially activate each of said plurality of sensing means, and means for selectively gating the first periodic signal, said selective gating means being operative to inhibit the first periodic signal in response to the signal level of said status signal.

17. The system of claim 16 wherein said means for sequentially activating each of said plurality of sensing means comprises:

means for generating a second periodic signal, and means for applying the second periodic signal to said means for periodically triggering said means for generating a status signal.

18. The system of claim 17 wherein each of said plurality of individually sensitive locations comprises:

pressure sensitive electroconductive means for conducting electrical current, said pressure sensitive electroconductive means being normally high in resistance when not under an externally applied pressure and low in resistance only when subjected to externally applied pressure.

19. The system of claim 18 wherein said plurality of pressure sensitive electroconductive means comprises:

a rigid matrix of conductors comprising:

a first plurality of conductors oriented in a first direction and lying on a first surface, a second plurality of conductors oriented in a second direction and lying on a second surface, and at least one conductive terminal on said first surface for each of said second plurality of conductors, each terminal being spaced from a respective conductor on the first surface.

20. The system of claim 19 wherein said plurality of pressure sensitive electroconductive means further comprises:
a layer of variable resistance material positioned over said first surface of said rigid matrix of conductors, said variable resistance material being pressure sensitive so as to normally be high in resistance when not under externally applied pressure and low in resistance when subjected to externally applied pressure.

21. The system of claim 20, wherein said variable resistance material is isotropically conductive.

22. The system of claim 13 wherein each of said plurality of individually sensitive locations comprises:
pressure sensitive electroconductive means for conducting electrical current, said electroconductive means being normally high in resistance when not under an externally applied pressure and low in resistance when subjected to externally applied pressure.

23. The system of claim 22 wherein said plurality of pressure sensitive electroconductive means comprises:
a rigid matrix of conductors comprising:
a first plurality of conductors oriented in a first direction and lying on a first surface,
a second plurality of conductors oriented in a second direction and lying on a second surface, and
at least one conductive terminal on said first surface for each of said second plurality of conductors, each terminal being spaced from a respective conductor on the first surface; and
a layer of variable resistance material positioned over said first surface of said rigid matrix of conductors, said variable resistance material being pressure sensitive so as to normally be high in resistance when not under externally applied pressure and low in resistance when subjected to externally applied pressure.

* * * * *

UNITED STATES PATENT OFFICE
CERTIFICATE OF CORRECTION

PATENT NO. : 4,013,835
DATED : March 22, 1977
INVENTOR(S) : Joseph J. Eachus, Theodore S. Graff and Douglas H. Seggelin It is certified that error appears in the above-identified patent and that said Letters Patent are hereby corrected as shown below:

Column 8, line 20, delete "directions" and insert --direction--.

Column 11, line 18, after "said" insert --pressure sensitive--.

Signed and Sealed this

Thirty-first Day of May 1977

[SEAL]

Attest:

RUTH C. MASON
Attesting Officer

C. MARSHALL DANN
Commissioner of Patents and Trademarks